(12) United States Patent
Zhou

(10) Patent No.: US 11,587,984 B2
(45) Date of Patent: Feb. 21, 2023

(54) DISPLAY SUBSTRATE AND PREPARATION METHOD THEREOF, AND DISPLAY PANEL

(71) Applicants: CHENDGU BOE OPTOELECTRONICS TECHNOLOGY CO., LTD., Sichuan (CN); BOE TECHNOLOGY GROUP CO., LTD., Beijing (CN)

(72) Inventor: Weilong Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 637 days.

(21) Appl. No.: 16/338,632

(22) PCT Filed: Sep. 13, 2018

(86) PCT No.: PCT/CN2018/105496
§ 371 (c)(1),
(2) Date: Apr. 1, 2019

(87) PCT Pub. No.: WO2019/100820
PCT Pub. Date: May 31, 2019

(65) Prior Publication Data
US 2021/0327970 A1    Oct. 21, 2021

(30) Foreign Application Priority Data

Nov. 22, 2017    (CN) .......................... 201711173972.0

(51) Int. Cl.
*H01L 27/32* (2006.01)
*H01L 51/52* (2006.01)
*H01L 51/56* (2006.01)

(52) U.S. Cl.
CPC ...... *H01L 27/3218* (2013.01); *H01L 27/3246* (2013.01); *H01L 51/5218* (2013.01); *H01L 51/5271* (2013.01); *H01L 51/56* (2013.01)

(58) Field of Classification Search
CPC ........................................................ H01L 25/48
(Continued)

(56) References Cited

U.S. PATENT DOCUMENTS 9,570,527 B2    2/2017    Namkung
9,685,634 B2    6/2017    Huangfu et al.
(Continued)

FOREIGN PATENT DOCUMENTS

CN    104282721 A    1/2015
CN    104733501 A    6/2015
(Continued)

OTHER PUBLICATIONS

The Extended European Search Report dated Jul. 28, 2021; Appln. No. 18859945.0.
(Continued)

*Primary Examiner* — Ajay Arora

(57) ABSTRACT

A display substrate and a preparation method thereof, and a display panel are provided. The display substrate includes at least one first sub-pixel and at least one second sub-pixel, the first sub-pixel and the second sub-pixel have different display directions, the first sub-pixel includes a first light-emitting element, the second sub-pixel includes a second light-emitting element, each of the first light-emitting element and the second light-emitting element has a light-emitting structure, the light-emitting structure includes a first reflective layer, a light emitting layer and a second reflective layer which are sequentially stacked, the second reflective layer is located on a light emergent side of the
(Continued)

display substrate, and an area of the first reflective layer is larger than an area of the second reflective layer.

20 Claims, 7 Drawing Sheets

(58) Field of Classification Search
USPC .......................................................... 257/40
See application file for complete search history.

(56) References Cited

U.S. PATENT DOCUMENTS

| | | |
|---|---|---|
| 2010/0109511 A1 | 5/2010 | Kim et al. |
| 2013/0112960 A1 | 5/2013 | Chaji et al. |
| 2014/0027735 A1 | 1/2014 | Kim et al. |
| 2016/0020430 A1* | 1/2016 | Kim .................... H01L 27/3258 257/40 |
| 2016/0111686 A1 | 4/2016 | Sato |

FOREIGN PATENT DOCUMENTS

| | | | |
|---|---|---|---|
| CN | 205880422 U | 1/2017 | |
| WO | WO-2019100820 A1 * | 5/2019 | ............. H01L 27/32 |

OTHER PUBLICATIONS

First Chinese Office Action dated Jun. 19, 2020; Application No. 201711173972.0

* cited by examiner

DISPLAY SUBSTRATE AND PREPARATION METHOD THEREOF, AND DISPLAY PANEL

The present application claims priority of Chinese Patent Application No. 201711173972.0 filed on Nov. 22, 2017, the disclosure of which is incorporated herein by reference in its entirety as part of the present application.

TECHNICAL FIELD

At least one embodiment of the present disclosure relates to a display substrate and a preparation method thereof, and a display panel.

BACKGROUND

As compared with a two-dimensional display technology, a three-dimensional display technology makes a display image more stereoscopic and more authentic, so the three-dimensional display technology is more and more favored by users; especially, a naked-eye three-dimensional display technology has got rid of bondage of glasses and has a broader application prospect.

However, as compared with the two-dimensional display technology, a current three-dimensional display product displays an image with relatively low brightness and resolution, which affects a user's experience.

SUMMARY

At least one embodiment of the disclosure provides a display substrate. The display substrate comprises: at least one first sub-pixel and at least one second sub-pixel, the first sub-pixel and the second sub-pixel having different display directions. The first sub-pixel includes a first light-emitting element and the second sub-pixel includes a second light-emitting element; each of the first light-emitting element and the second light-emitting element has a light-emitting structure, the light-emitting structure includes a first reflective layer, a second reflective layer opposite to the first reflective layer, and a light emitting layer provided between the first reflective layer and the second reflective layer, the second reflective layer is located on a light emergent side of the display substrate; and an area of the first reflective layer is larger than an area of the second reflective layer.

For example, in the display substrate provided by at least one embodiment of the disclosure, in each of the light-emitting structures, along the display direction, the first reflective layer includes a first portion overlapping with the second reflective layer and a second portion not overlapping with the second reflective layer.

For example, in the display substrate provided by at least one embodiment of the disclosure, an included angle between a tangent plane of a surface, facing the light emitting layer, of the second portion and a plane where the display substrate is located is about 15 to 45 degrees.

For example, in the display substrate provided by at least one embodiment of the disclosure, the second portion is located at an end, close to the light emergent side of the display substrate, of the first reflective layer; or the second portion is located in a middle portion of the first reflective layer.

For example, in the display substrate provided by at least one embodiment of the disclosure, an area ratio of the second portion to the first reflective layer is 5% to 15%.

For example, in the display substrate provided by at least one embodiment of the disclosure, a distance between an end, close to the second portion, of the first portion and the second reflective layer is greater than a distance between an end, facing away from the second portion, of the first portion and the second reflective layer.

For example, in the display substrate provided by at least one embodiment of the disclosure, from an end, facing away from the second portion, of the first portion to an end, close to the second portion, of the first portion, a distance between the first reflective layer and the second reflective layer gradually increases.

For example, the display substrate according to at least one embodiment of the disclosure further comprises a pixel defining layer. A plurality of grooves are provided in the pixel defining layer, the light-emitting structure is located in the groove, and the groove includes at least one first side surface which is an inclined surface with respect to a plane where the display substrate is located, and the second portion is located on the first side surface.

For example, in the display substrate provided by at least one embodiment of the disclosure, a portion, overlapping with the second portion, of the first side surface is a flat surface or a curved surface.

For example, in the display substrate provided by at least one embodiment of the disclosure, the light-emitting structure includes an organic light emitting device, the light emitting layer is an organic light emitting layer, the organic light emitting device includes a first electrode, a second electrode, and the organic light emitting layer located between the first electrode and the second electrode; and the second electrode is located on the light emergent side of the display substrate.

For example, in the display substrate provided by at least one embodiment of the disclosure, the first electrode and the first reflective layer are integral; and/or the second electrode and the second reflective layer are integral.

For example, in the display substrate provided by at least one embodiment of the disclosure, at least one of the first light-emitting element and the second light-emitting element further includes: an optical medium layer, located between the first reflective layer and the light emitting layer or located between the second reflective layer and the light emitting layer.

For example, in the display substrate provided by at least one embodiment of the disclosure, a thickness of a portion, overlapping with the second portion, of the optical medium layer is greater than a thickness of a portion, overlapping with the first portion, of the optical medium layer.

For example, in the display substrate provided by at least one embodiment of the disclosure, from an end, facing away from the second portion, of the first portion to an end, close to the second portion, of the first portion, the thickness of the portion, overlapping with the first portion, of the optical medium layer gradually increases.

For example, in the display substrate provided by at least one embodiment of the disclosure, a tangent plane of a surface, facing the light emitting layer, of the first reflective layer with respect to a plane where the display substrate is located is an inclined surface.

For example, in the display substrate provided by at least one embodiment of the disclosure, an included angle between the tangent plane of the surface, facing the light emitting layer, of the first reflective layer and the plane where the display substrate is located is about 15 to 45 degrees.

At least one embodiment of the disclosure provides a display panel. The display panel comprises the display substrate according to any one of the embodiments as described above.

At least one embodiment of the disclosure provides a preparation method of a display substrate. The display substrate comprises at least one first sub-pixel and at least one second sub-pixel, and the method comprises: forming a light-emitting structure, the light-emitting structure including a first reflective layer, a second reflective layer opposite to the first reflective layer, and a light emitting layer located between the first reflective layer and the second reflective layer; forming a first light-emitting element including the light-emitting structure in the first sub-pixel, and forming a second light-emitting element including the light-emitting structure in the second sub-pixel. The second reflective layer is located on a light emergent side of the display substrate, and an area of the first reflective layer is larger than an area of the second reflective layer; and a light emission direction of the first light-emitting element and a light emission direction of the second light-emitting element are different from each other, such that the first sub-pixel and the second sub-pixel have different display directions.

For example, the preparation method according to at least one embodiment of the disclosure further comprises: forming a pixel defining layer, forming a plurality of grooves in the pixel defining layer, and forming at least one first side surface of the groove into an inclined surface with respect to a plane where the display substrate is located. The light-emitting structure is formed in the groove, and the second portion of the first reflective layer is formed on the first side surface.

For example, in the preparation method of the display substrate according to at least one embodiment of the disclosure, a portion, overlapping with the second portion, of the first side surface is formed into a flat surface or a curved surface.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMBERS

Figure 1:
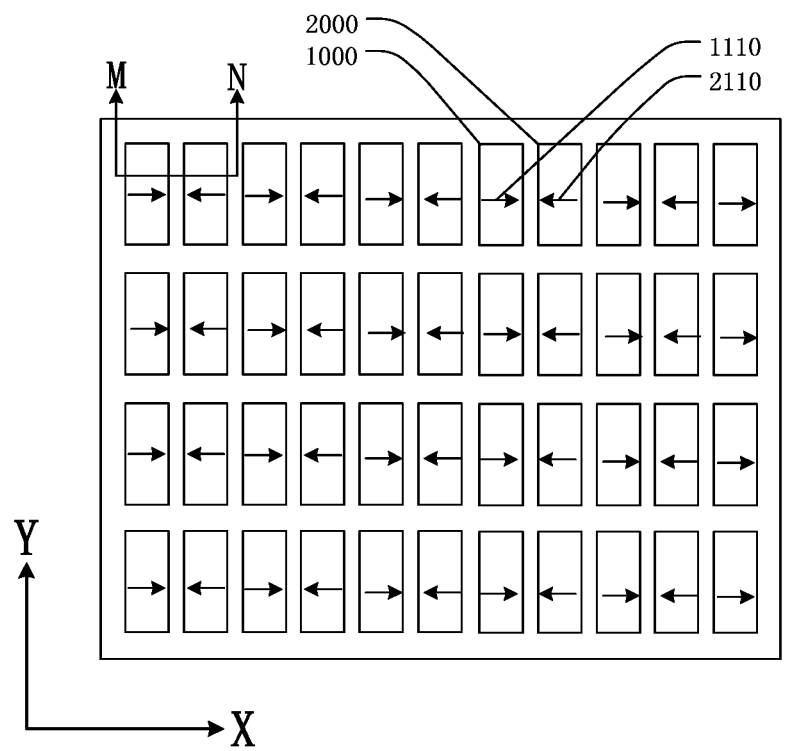
FIG. 1 is a plan view of a display substrate provided by at least one embodiment of the present disclosure.

100—light-emitting structure; 110—first reflective layer; 111—first portion; 112—second portion; 1121—light emergent surface; 120—second reflective layer; 130—light emitting layer, 140—first electrode; 150—second electrode; 160—optical medium layer, 200—base; 300—pixel defining layer; 310—groove; 400—mask; 410—first region; 420—second region; 430—third region; 1000—first sub-pixel; 1100—first light-emitting element; 1110—first direction; 2000—second sub-pixel; 2100—second light-emitting element; 2110—second direction.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

At least one embodiment of the present disclosure provides a display substrate, the display substrate comprises at least one first sub-pixel and at least one second sub-pixel, the first sub-pixel and the second sub-pixel have different display directions, the first sub-pixel includes a first light-emitting element and the second sub-pixel includes a second light-emitting element. For example, the first light-emitting element is configured such that a normal to a light emergent surface thereof has a first direction, and the first direction serves as the display direction of the first sub-pixel; and the second light-emitting element is configured such that a normal to a light emergent surface thereof has a second direction, and the second direction serves as the display direction of the second sub-pixel. For example, the first direction and the second direction intersect with each other. The first sub-pixel and the second sub-pixel of the display substrate emit light in different directions, that is, light emitted from the first sub-pixel and light emitted from the second sub-pixel respectively constitute different parallax images, so that the display substrate has a three-dimensional display function, and in this case, light constituting the parallax images is not lost, so that the parallax images have a higher brightness. In addition, it is not necessary to provide an external auxiliary component (for example, an optical grating, and the like) for the display substrate, or it is not necessary to adjust arrangement of sub-pixel units in the display substrate; and further, light emitted from each sub-pixel is received by a user, which ensures that the three-dimensional display image provided by the display substrate has a higher resolution.

It should be noted that, in at least one embodiment of the present disclosure, light rays emitted from the first light-emitting element are not strictly emitted in parallel to each other but tend to be in the first direction, and there may be a certain divergence angle between the light rays emitted from the first light-emitting element; and light rays emitted from the second light-emitting element are not strictly emitted in parallel to each other but tend to be in the second direction, and there may a certain divergence angle between the light rays emitted from the second light-emitting element. That is, a propagation direction of light in the display direction is distributed within a certain angle range with the first direction or the second direction as a baseline. For example, an included angle between the display direction of the first sub-pixel and the first direction is within 0 to 10 degrees, further within 0 to 5 degrees; and an included angle between the display direction of the second sub-pixel and the second direction is within 0 to 10 degrees, further within 0 to 5 degrees.

Hereinafter, the display substrate and a preparation method thereof, and a display panel according to at least one embodiment of the present disclosure will be described in conjunction with the accompanying drawings.

Figure 2:
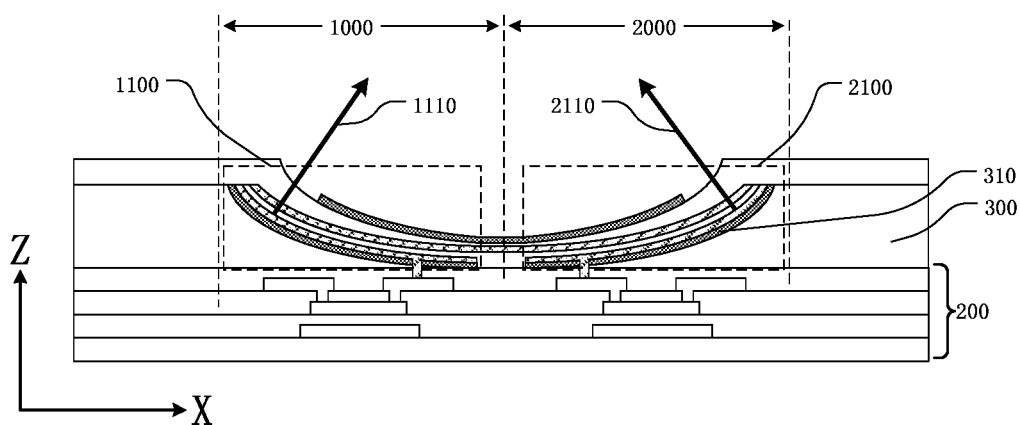
FIG. 2 is a cross-sectional view of the display substrate shown in FIG. 1 taken along M-N.

FIG. 1 is a plan view of the display substrate provided by at least one embodiment of the present disclosure; and FIG. 2 is a cross-sectional view of the display substrate shown in FIG. 1 along M-N.

Figure 3A:
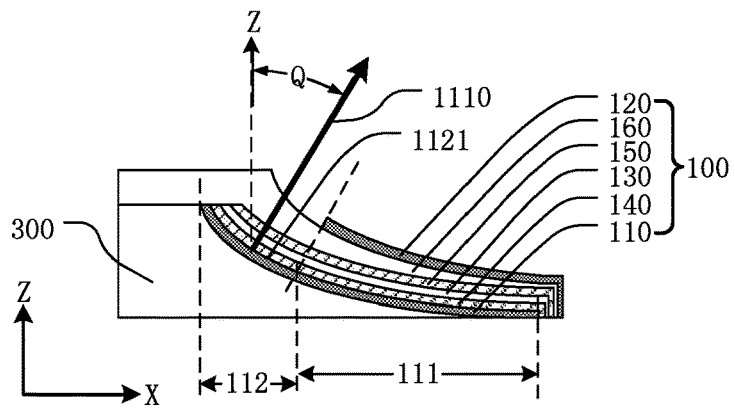
FIG. 3A is a partial structural schematic diagram of the display substrate shown in FIG. 2.
Figure 3B:
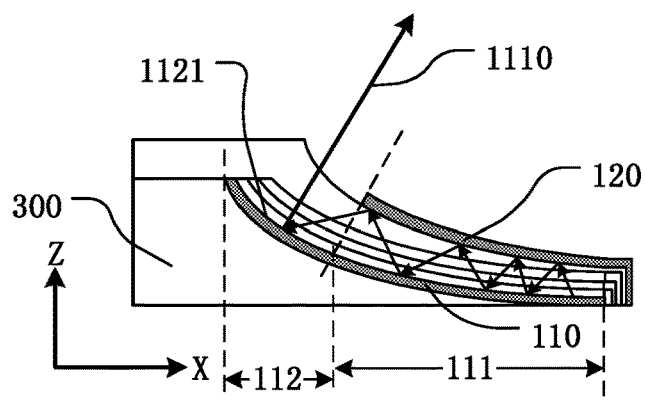
FIG. 3B is an optical path diagram of a light-emitting structure in the display substrate shown in FIG. 3A.

At least one embodiment of the present disclosure provides the display substrate, and as shown in FIG. 1 and FIG. 2, the display substrate comprises at least one first sub-pixel 1000 and at least one second sub-pixel 2000, the first sub-pixel 1000 includes the first light-emitting element 1100, the second sub-pixel 2000 includes the second light-emitting element 2100, the first light-emitting element 1100 is configured such that the normal to the light emergent surface thereof has the first direction 1110, and the second light-emitting element 2100 is configured such that the normal to the light emergent surface thereof has the second direction 2110. For example, in at least one embodiment of the present disclosure, "the normal to the light emergent surface" refers to a normal to a center position of the light emergent surface. For example, the center position is a centroid of the light emergent surface. For example, the light emergent surface is not shown in FIG. 1 and FIG. 2, and the light emergent surface 1121 in FIG. 3A and FIG. 3B is referred to.

As shown in FIG. 2, the first direction 1110 and the second direction 2110 face a display side of the display substrate and intersect with each other. In this way, a parallax image constituted by light emitted from a plurality of first sub-pixels 1000 propagates in the first direction 1110, and a parallax image constituted by light emitted from a plurality of second sub-pixels 2000 propagates in the second direction 2110, the left eye and the right eye of a user respectively receive different parallax images, so that the display substrate has the three-dimensional display function. For example, the plurality of first sub-pixels 1000 and the plurality of second sub-pixels 2000 are in one-to-one correspondence with each other, for example, one of the plurality of first sub-pixels 1000 and one of the plurality of second sub-pixels 2000 are adjacently arranged in a row direction of the display device (a horizontal direction in a case where the display device is vertically placed on a pedestal) to form a sub-pixel pair. In at least one embodiment of the present disclosure, a mode for combining and arranging the first sub-pixels 1000 and the second sub-pixels 2000 will not be limited.

Light emitted from the first sub-pixel 1000 and light emitted from the second sub-pixel 2000 directly enter the eyes of the user, so that light constituting the parallax images is not lost ant thus the parallax images have a high brightness. In addition, light emitted from each sub-pixel in the display substrate is completely received by the user, which ensures that the three-dimensional display image provided by the display substrate has a higher resolution.

It should be noted that, light emitted from a same sub-pixel in the display substrate has a certain divergence angle and does not completely propagate in a same direction; however, through design of the light emergent surface of the sub-pixel, light emitted from the same sub-pixel tend to be in the same direction, so as to reduce interference between parallax images (for example, prevent different parallax images from entering a same eye of the user), and improve an effect of the three-dimensional display image. For example, the first light-emitting element 1100 in the first sub-pixel 1000 is configured such that the normal to the light emergent surface thereof has the first direction 1110 so that light emitted from the first sub-pixel 1000 tends to be in the first direction 1110; and the second light-emitting element 2100 in the second sub-pixel 2000 is configured such that the normal to the light emergent surface thereof has the second direction 2110 so that light emitted from the second sub-pixel 2000 tends to be in the second direction 2110.

For example, in at least one embodiment of the present disclosure, as shown in FIG. 2, the display substrate for example further comprises a base 200. The first light-emitting element 1100 in the first sub-pixel 1000 and the second light-emitting element 2100 in the second sub-pixel 2000 are both located on the base 200. For example, a switching element, a control circuit and the like may be provided in the base 200, and the switching element and the control circuit may control ON/OFF or light emission intensities of the first light-emitting element 1100 and the second light-emitting element 2100.

Hereinafter, a spatial rectangular coordinate system is established with reference to the base 200 shown in FIG. 2, to explain positions of respective structures in the display substrate. For example, in the spatial rectangular coordinate system, an X-axis and a Y-axis are parallel to a plane where the base 200 of the display substrate is located, and a Z-axis is perpendicular to the plane where the base 200 is located. Further, in the embodiments below, directions of respective structures in the display substrate are designated with reference to the base 200. Exemplarily, with the first light-emitting element 1100 as an example, an "upper surface" of the first light-emitting element 1100 is a surface of the first light-emitting element 1100 facing away from the base 200, and a "lower surface" of the first light-emitting element 1100 is a surface of the first light-emitting element 1100 close to the base 200, directions "above" and "below" the first light-emitting element 1100 refer to directions along the Z-axis, and the direction "above" is a direction of a side of the first light-emitting element 1100 facing away from the base 200, and the direction "below" is a direction of a side of the first light-emitting element 1100 close to the base 200; accordingly, an "upper end" of the first light-emitting element 1100 is a portion of the first light-emitting element 1100 facing away from the base 200, and a "lower end" of the first light-emitting element 1100 is a portion of the first light-emitting element 1100 close to the base 200.

In at least one embodiment of the present disclosure, specific structures of the first light-emitting element 1100 and the second light-emitting element 2100 will not be limited, as long as light emitted from the first light-emitting element 1100 tends to be in the first direction 1110, and light emitted from the second light-emitting element 2100 tends to be in the second direction 2110.

In at least one embodiment of the present disclosure, a structural relationship between the first light-emitting element and the second light-emitting element is not limited. Exemplarily, as shown in FIG. 1 and FIG. 2, the first light-emitting element 1100 and the second light-emitting element 2100 are similar in structure and are symmetrically provided such that the first light-emitting element 1100 and the second light-emitting element 2100 have different light emission directions. Hereinafter, a specific structure of the display substrate will be further analyzed with the first sub-pixel 1000 as an example.

FIG. 3A is a partial structural schematic diagram of the display substrate shown in FIG. 2, which is a structural schematic diagram of the first sub-pixel 1000 in the display substrate.

For example, in the display substrate provided by at least one embodiment of the present disclosure, the first light-emitting element and the second light-emitting element respectively have a light-emitting structure, the light-emitting structure includes a first reflective layer, a second reflective layer opposite to the first reflective layer, and a light emitting layer provided between the first reflective layer and the second reflective layer, the second reflective layer is located on a light emergent side of the display substrate, and an area of the first reflective layer is larger than an area of the second reflective layer. For example, in each light-emitting structure, the first reflective layer includes a first portion overlapping with the second reflective layer and a second portion not overlapping with the second reflective layer along a display direction (the first direction or the second direction of the light-emitting structure). Exemplarily, as shown in FIG. 2 and FIG. 3A, the first light-emitting element 1100 and the second light-emitting element 2100 respectively have the light-emitting structure 100, the light-emitting structure 100 includes the first reflective layer 110, the second reflective layer 120 opposite to the first reflective layer 110, and the light emitting layer 130 provided between the first reflective layer 110 and the second reflective layer 120; the second reflective layer 120 is located on the light emergent side of the display substrate (i.e., the second reflective layer 120 is located above the first reflective layer 110); and the first reflective layer 110 includes the first portion 111 overlapping with the second reflective layer 120 in a light emission direction of the light-emitting structure 100 and the second portion 112 not overlapping with the second reflective layer 120 in the light emission direction of the light-emitting structure 100. As shown in FIG. 3A, with respect to the first light-emitting element 1100 in the first sub-pixel 1000, light emitted from the light emitting layer 130 in the light-emitting structure 100 is totally reflected between the first reflective layer 110 and the second reflective layer 120, then converged on the second portion 112 of the first reflective layer 110 and reflected by the second portion 112, so that light from the light-emitting structure 100 tend to be in a same direction (for example, the first direction 1110), so as to improve brightness of light emitted from the light-emitting structure 100. Similarly, with respect to the second light-emitting element 2100 in the second sub-pixel 2000, light from the light-emitting structure 100 tends to be in the second direction 2110.

In at least one embodiment of the present disclosure, as shown in FIG. 2 and FIG. 3A, the light emergent surface 1121 of the light-emitting structure 100 for example is a portion, that participates in reflecting light, of an upper surface of the second portion 112. Exemplarily, in a case where the upper surface of the second portion 112 all participates in reflecting light in the light-emitting structure 100, the upper surface of the second portion 112 is the light emergent surface 1121 of the light-emitting structure 100. Light in the light-emitting structure 100 is reflected out by the second portion 112, so that the direction of the emergent light of the light-emitting structure 100 may be adjusted by adjusting a shape of the upper surface of the second portion 112 and a tilt angle thereof with respect to a plane where the base 200 is located.

In at least one embodiment of the present disclosure, the shape of the upper surface of the second portion will not be limited, as long as the shape of the second portion causes light emitted from the light-emitting structure to converge toward the first direction or the second direction. The upper surface of the second portion for example is a flat surface or a curved surface (for example, an arc surface). Exemplarily, as shown in FIG. 2 and FIG. 3A, the upper surface of the second portion 112 is the arc surface, which thus further converges reflected light toward the first direction 1110, so as to improve brightness of light emitted from the light-emitting structure 100.

For example, in the display substrate provided by at least one embodiment of the present disclosure, an included angle between a tangent plane of the upper surface of the second portion and the plane where the display substrate is located is about 15 to 45 degrees, and further, for example, about 20 degrees, about 30 degrees, about 40 degrees, and so on. Exemplarily, as shown in FIG. 2 and FIG. 3A, an included angle between the upper surface of the second portion 112 and a direction of the X-axis is about 15 to 45 degrees, and accordingly, an included angle Q between the first direction 1110 and a direction of the Z-axis ranges from 15 to 45 degrees. It should be noted that, in at least one embodiment of the present disclosure, a numerical range of the included angle Q will not be limited, which may be designed according to actual needs for implementing the three-dimensional display image.

In at least one embodiment of the present disclosure, a light emergent position in the light-emitting structure (e.g., a position of the second portion of the first reflective layer) will not be limited.

For example, in the display substrate provided by at least one embodiment of the present disclosure, the second portion is located at an end, close to the light emergent side of the display substrate, of the first reflective layer. Exemplarily, as shown in FIG. 2 and FIG. 3A, in a direction parallel to the first direction 1110, an upper end portion of the first reflective layer 110 does not overlap with the second reflective layer 120, and such upper end portion serves as the second portion 112. The second portion 112 is located at the end, close to the light emergent side of the display panel, of the first reflective layer 110, so that light emitted from the light-emitting structure 100 will not be blocked by peripheral components, which improves transmittance.

Figure 3C:
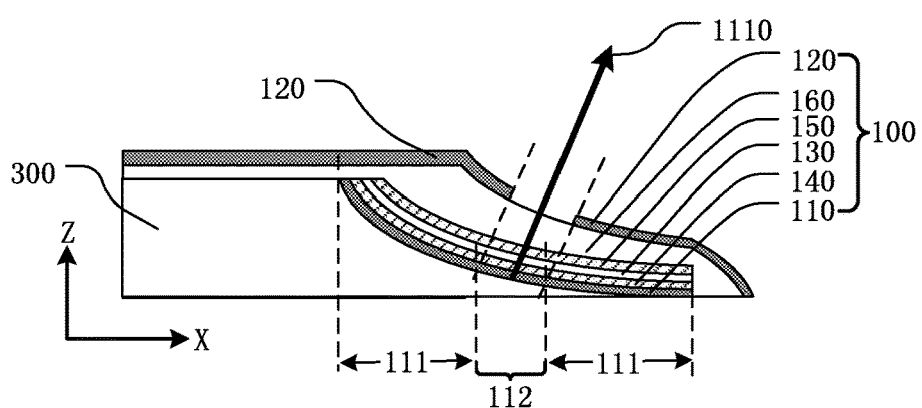
FIG. 3C is another partial structural schematic diagram of the display substrate shown in FIG. 1.

For example, in the display substrate provided by at least one embodiment of the present disclosure, the second portion is located in a middle portion of the first reflective layer. As shown in FIG. 3C, in the direction parallel to the first direction 1110, the middle portion of the first reflective layer 110 does not overlap with the second reflective layer 120, and the middle portion serves as the second portion 112. The second portion 112 is located in the middle region (e.g., a central region) of the first reflective layer 110, an area of an opening region (a region overlapping with the second portion 112) of the second reflective layer 120 is substantially equal to an area of the second portion 112, and thus, the divergence angle of the emergent light is limited, so that light converges toward the first direction 1110 to a higher extent, that is, it is easy for the light-emitting structure 100 of the above-described structure to control the direction of the emergent light.

For example, the second portion 112 is located at an end, close to the base 200, of the first reflective layer 110, or located at other position of the first reflective layer 110, as long as light in the light-emitting structure 100 is normally emitted.

Hereinafter, a technical solution in at least one following embodiment of the present disclosure will be described with a case where the second portion is located at the end, close to the light emergent side of the display substrate, of the first reflective layer as an example.

For example, in the display substrate provided by at least one embodiment of the present disclosure, as shown in FIG. 2, the first sub-pixel 1000 and the second sub-pixel 2000 share a same second reflective layer 120, so that a preparation process of the display substrate is simplified, which reduces costs.

In at least one embodiment of the present disclosure, an area ratio of the second portion to the first reflective layer will not be limited, and may be set according to actual needs, as long as requirements on the light emission amount and the light emission direction of the light-emitting structure am satisfied. The light-emitting structure reflects light through the second portion to form the parallax image; and in a case where the area ratio of the second portion to the first reflective layer is too small, light reflected by the second portion is limited, and the light emission amount satisfying the requirement is relatively small. In a case where the area ratio of the second portion to the first reflective layer is relatively large, a divergence degree of light emitted from the light-emitting structure may be large, which is not favorable for controlling the light emission direction of the light-emitting structure.

For example, in at least one embodiment of the present disclosure, the area ratio of the second portion to the first reflective layer is about 5% to 15%, further, for example, about 8%, 10%, 12%, and so on. Exemplarily, as shown in FIG. 2 and FIG. 3A, a ratio of an area of the surface of the second portion 112 facing away from the base 200 to an area of the surface of the first reflective layer 110 facing away from the base 200 is 5% to 15%. In this way, the light emission amount of the light-emitting structure satisfies the display requirement, and a degree of collimation of light emitted from the light-emitting structure (which tends to be in the first direction or the second direction) is relatively high.

For example, in the display substrate provided by at least one embodiment of the present disclosure, a distance between an end, close to the second portion, of the first portion and the second reflective layer is greater than a distance between an end, facing away from the second portion, of the first portion and the second reflective layer. FIG. 3B is an optical path diagram of the light-emitting structure in the display substrate shown in FIG. 3A. Exemplarily, as shown in FIG. 3A and FIG. 3B, the distance between the end, close to the second portion 112, of the first portion 111 and the second reflective layer 120 is greater than the distance between the end, facing away from the second portion 112, of the first portion 111 and the second reflective layer 120, and thus, light emitted from the light emitting layer 130 mainly propagates toward a direction close to the second portion 112 during the reflection process, which increases the light emission amount of the light-emitting structure 100.

For example, in the display substrate provided by at least one embodiment of the present disclosure, from the end, facing away from the second portion, of the first portion to the end, close to the second portion, of the first portion, a distance between the first reflective layer and the second reflective layer gradually increases. Exemplarily, as shown in FIG. 3A and FIG. 3B, from the end, facing away from the second portion 112, of the first portion 111 to the end, close to the second portion 112, of the first portion 111, the distance between the first reflective layer 110 and the second reflective layer 120 gradually changes, which thus further ensures that light reflected in the light-emitting structure 100 propagates toward the second portion 112, to further increase the light emission amount of the light-emitting structure 100.

For example, in at least one embodiment of the present disclosure, at the end, facing away from the second portion, of the first portion of the first reflective layer, the first reflective layer and the second reflective layer constitute a closed structure, without affecting the function of the light-emitting structure. For example, the closed structure is wedge-shaped such that light in the light-emitting structure only is reflected from a region where the second portion is located, so as to increase the light emission amount of the light-emitting structure.

In at least one embodiment of the present disclosure, a shape of the surface of the first reflective layer is limited. For example, in the display substrate provided by at least one embodiment of the present disclosure, at least the surface of the second portion of the first reflective layer is the flat surface or the curved surface. The surface of the first portion of the first reflective layer is the flat surface or the curved surface, or may be other shape, as long as light reflected inside the light-emitting structure propagates toward the second portion.

It should be noted that, in a case where the upper surface of the second portion is provided as an inclined surface to have a certain included angle with respect to a plane where the display substrate is located, light emitted from the light-emitting structure tends to be in a fixed direction (for example, the first direction 1110 or the second direction 2110). As shown in FIG. 3A and FIG. 3B, the first portion 111 of the first reflective layer 110 also is an inclined surface with respect to the plane where the base 200 is located. For example, an included angle between the first portion 111 and the plane where the base 200 is located is about 15 to 45 degrees, and further, for example, about 20 degrees, about 30 degrees, about 40 degrees, and so on.

In at least one embodiment of the present disclosure, a tilt angle of the upper surface of the first portion of the first reflective layer with respect to the plane where the base 200 is located is designed. For example, the first portion is provided such that a plane where the first portion is located is parallel to the plane where the base 200 is located (the plane where the display substrate is located), that is, the tilt angle of the upper surface of the first portion with respect to the plane where the base 200 is located is zero. For example, the upper surface of the first portion is set as an inclined surface with respect to the plane where the base 200 is located (the plane where the display substrate is located) (with reference to the arrangement mode of the second portion 112 in the embodiments shown in FIG. 2 and FIG. 3A). Exemplarily, as shown in FIG. 3A and FIG. 3B, the first reflective layer 110 is set as the inclined surface, so that an area of the light emitting layer 130 is increased without changing a design size of the sub-pixel (for example, the first sub-pixel 1000), which increases the light emission amount of the light-emitting structure 100, and improves brightness of the display image of the display substrate.

For example, in the display substrate provided by at least one embodiment of the present disclosure, the light-emitting structure includes an organic light emitting device; the light emitting layer is an organic light emitting layer; the organic light emitting device includes a first electrode, a second electrode, and the organic light emitting layer located between the first electrode and the second electrode; and the second electrode is located on the light emergent side of the display substrate. Exemplarily, as shown in FIG. 2, FIG. 3A and FIG. 3B, the organic light emitting device in the light-emitting structure 100 includes the first electrode 140, the light emitting layer 130 (the organic light emitting layer) and the second electrode 150; and the light emitting layer 130 is located between the first electrode 140 and the second electrode 150. The first electrode 140 and the second electrode 150 apply a voltage to the light emitting layer 130, to enable the light emitting layer 130 to emit light. In at least one embodiment of the present disclosure, a specific structure of the organic light emitting device is not limited, and the organic light emitting device further includes, for example, a hole injection layer, a hole transport layer, an electron transport layer, an electron injection layer, and the like.

For example, in at least one embodiment of the present disclosure, at least a portion of the structures in the organic light emitting device is shared in the first sub-pixel and the second sub-pixel. Exemplarily, as shown in FIG. 2, FIG. 3A and FIG. 3B, at least one of the light emitting layer 130, the second electrode 150, the hole injection layer, the hole transport layer, the electron transport layer, the electron injection layer, and the like is shared in the first sub-pixel 1000 and the second sub-pixel 2000, which thus simplifies the preparation process of the display substrate, and reduces costs.

In at least one embodiment of the present disclosure, a material for preparing the light emitting layer 130 (the organic light emitting layer) in the organic light emitting device is not limited. For example, the material for preparing the light emitting layer 130 is selected according to different colors of light (for example, red light, green light, blue light or white light, etc.) to be emitted from the light emitting layer 130. For example, the material for preparing the light emitting layer 130 includes a fluorescent light-emitting material or a phosphorescent light-emitting material. For example, a doping system may be used in the light emitting layer 130, that is, a dopant material is mixed into a host light-emitting material to obtain a usable light emitting material. For example, the host light-emitting material is a metal compound material, a derivative of anthracene, an aromatic diamine compound, a triphenylamine compound, an aromatic triamine compound, a biphenylenediamine derivative, or a triarylamine polymer, and the like.

In at least one embodiment of the present disclosure, a material for preparing the first electrode 140 and the second electrode 150 are not limited. For example, one of the first electrode 140 and the second electrode 150 is set as an anode, and the other is set as a cathode. For example, the anode is made of a transparent conductive material having a high work function, and the transparent conductive material for example includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), a carbon nanotube, and the like; for example, the cathode is made of an electrode material having a high conductivity and a low work function, and the electrode material for example includes an alloy such as a magnesium aluminum alloy (MgAl) and a lithium aluminum alloy (LiAl), or a single metal such as magnesium, aluminum, lithium and silver.

In at least one embodiment of the present disclosure, distribution of the organic light emitting device on the first reflective layer is not limited, and the organic light emitting device for example is set to cover an entirety of the first reflective layer, or is set to cover a portion of the first reflective layer. However, in a case where the organic light emitting device overlaps with the second portion of the first reflective layer, light emitted from such overlapping portion may be directly emitted out from the light-emitting structure, and the light directly emitted out may be divergent to a greater extent, which will affect the effect of the display image of the display substrate.

Figure 4:
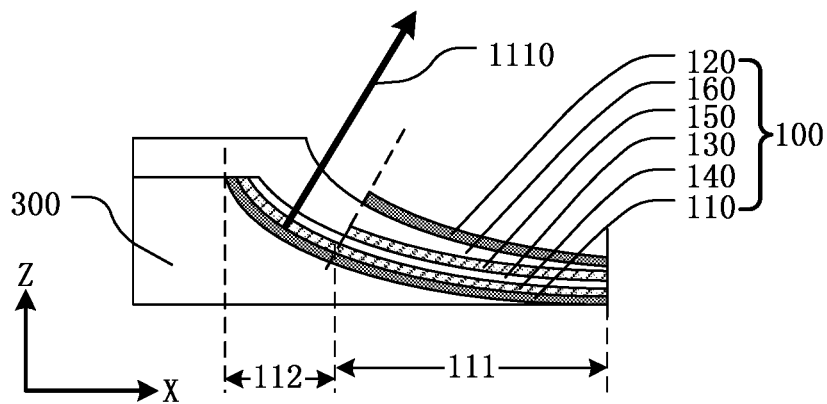
FIG. 4 is another partial structural schematic diagram of the display substrate provided by at least one embodiment of the present disclosure.

For example, in the display substrate provided by at least one embodiment of the present disclosure, an effective light emitting region in the organic light emitting device is provided only in a region where the first reflective layer and the second reflective layer coincide with each other. FIG. 4 is another partial structural schematic diagram of the display substrate provided by at least one embodiment of the present disclosure. Exemplarily, as shown in FIG. 4, in the direction parallel to the first direction 1110, the second electrode 150 of the organic light emitting device is provided only on the first portion 1. In this way, light emitted from the organic light emitting device is totally reflected between the first reflective layer 110 and the second reflective layer 120, and then reflected and emitted from the second portion 112, so that the direction in which light emitted from the light-emitting structure 100 propagates tends to be the first direction 1110. The solution for implementing the above-described technical effect is not limited thereto, for example, other structures in the organic light emitting device, for example, the first electrode 110, the light emitting layer 130, and so on, are provided only on the first portion 111.

For example, in the display substrate provided by at least one embodiment of the present disclosure, the first electrode and the first reflective layer are integral; and/or the second electrode and the second reflective layer are integral. In this way, the structure of the light-emitting structure is simplified, so as to simplify the preparation process of the substrate, and reduce costs.

A thickness of the organic light emitting device is relatively small, and in a case where only the organic light emitting device is provided between the first reflective layer 110 and the second reflective layer 120, a phenomenon such as interference (for example, destructive interference or constructive interference) may occur when light propagates between the first reflective layer 110 and the second reflective layer 120, which affects uniformity of the light emission amount and the light emission intensity of the light-emitting structure 100.

For example, in the display substrate provided by at least one embodiment of the present disclosure, at least one of the first light-emitting element and the second light-emitting element further includes an optical medium layer, and the optical medium layer is provided between the first reflective layer and the second reflective layer. For example, as shown in FIG. 3A, FIG. 3B and FIG. 4, the light-emitting structure 100 further includes the optical medium layer 160 provided between the first reflective layer 110 and the second reflective layer 120. The optical medium layer 160 increases a distance between the first reflective layer 110 and the second reflective layer 120, to prevent light from interfering between the first reflective layer 110 and the second reflective layer 120. Further, the optical medium layer 160 has a relatively large thickness; by performing a patterning process on the optical medium layer 160, the distance between the first reflective layer 110 and the second reflective layer 120 is adjusted by changing the thickness of the optical medium layer 160.

For example, the optical medium layer 160 is made of a transparent material. For example, the transparent material is polyimide, polymethyl methacrylate, polyethylene glycol terephthalate or other resin materials. For example, the transparent material further includes a photoresist material (e.g., photoresist).

For example, in at least one embodiment of the present disclosure, a thickness of a portion, that overlaps with the second portion, of the optical medium layer is greater than a thickness of a portion, that overlaps with the first portion, of the optical medium layer. For example, from the end, facing away from the second portion, of the first portion to the end, close to the second portion, of the first portion, the thickness of the portion, that overlaps with the first portion, of the optical medium layer gradually increases. Exemplarily, as shown in FIG. 4, the thickness of the optical medium layer 160 increases as a distance of the optical medium layer 160 from the base 200 increases, so that the distance between the first reflective layer 110 and the second reflective layer 120 increases as a distance from the base 200 increases. In this way, light emitted from the light emitting layer 130 converges toward the second portion 112 during the procedure of reflection between the first reflective layer 110 and the second reflective layer 120, and the light-emitting structure 100 has a high light emission amount.

In at least one embodiment of the present disclosure, a specific position of the optical medium layer between the first reflective layer and the second reflective layer is not limited. For example, in the display substrate provided by at least one embodiment of the present disclosure, the optical medium layer is located between the first reflective layer and the light emitting layer; or located between the second reflective layer and the light emitting layer. Exemplarily, as shown in FIG. 3A, FIG. 3B and FIG. 4, the optical medium layer 160 is located between the second reflective layer 120 and the light emitting layer 130, in which case the second electrode 150 is located between the optical medium layer 160 and the light emitting layer 130, and the second electrode 150 is configured to be a transparent electrode, such that light emitted from the light emitting layer 130 enters the optical medium layer 160. Or, exemplarily, the optical medium layer is located between the first reflective layer and the light emitting layer, accordingly, the first electrode is located between the optical medium layer and the light emitting layer, and the first electrode is configured to be a transparent electrode, such that light emitted from the light emitting layer enters the optical medium layer.

In at least one embodiment of the present disclosure, a structure of the light-emitting structure in the first light-emitting element and the second light-emitting element is not limited to the structures as shown in FIG. 2, FIG. 3A, FIG. 3B and FIG. 4, as long as light emitted from the light-emitting structure in the first light-emitting element tends to be in the first direction and light emitted from the light-emitting structure in the second light-emitting element tends to be in the second direction.

Figure 5A:
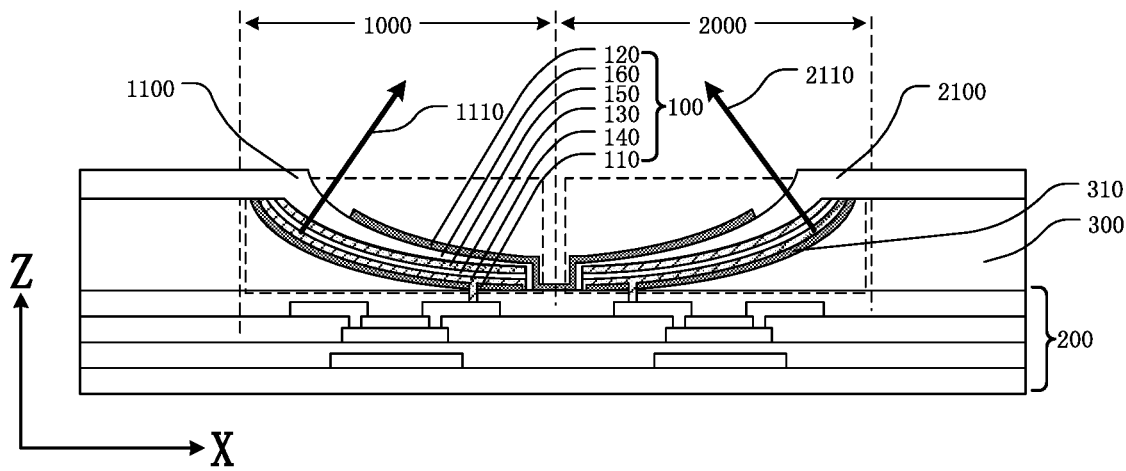
FIG. 5A is another cross-sectional view of the display substrate provided by at least one embodiment of the present disclosure.
Figure 5B:
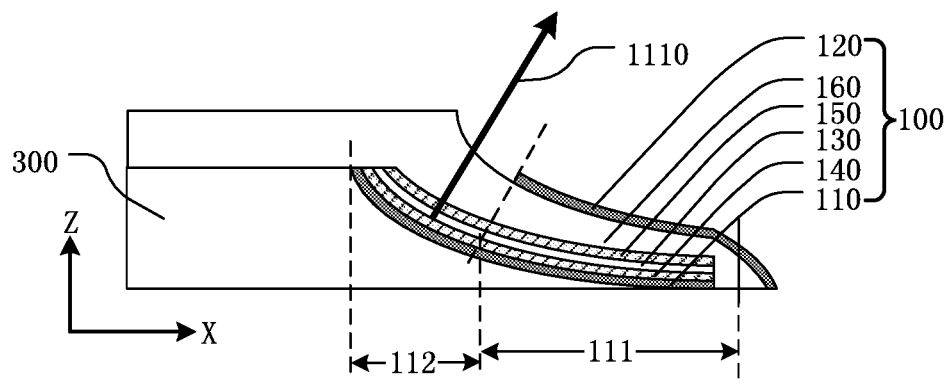
FIG. 5B is a partial structural schematic diagram of a first sub-pixel shown in FIG. 5A.

FIG. 5A is a cross-sectional view of another display substrate provided by at least one embodiment of the present disclosure; and FIG. 5B is a partial structural schematic diagram of the first sub-pixel shown in FIG. 5A. For example, in at least one embodiment of the present disclosure, as shown in FIG. 5A, the first sub-pixel 1000 and the second sub-pixel 2000 adjacent to each other are located in a same groove 310, and the light emitting layer 130 in the first sub-pixel 1000 and the light emitting layer 130 in the second sub-pixel 2000 are separately provided to respectively emit light of different colors. It should be noted that, the second electrode 150 may be set as a common electrode of the first sub-pixel 1000 and the second sub-pixel 2000 as shown in FIG. 5A, or may be separately provided in the first sub-pixel 1000 and the second sub-pixel 2000. For example, in each light-emitting structure 100, the optical medium layer 160 is provided to cover the second electrode 150 of the organic light emitting device, such that the optical medium layer 160 separates the first electrode 140 from the second reflective layer 120 or the second electrode 150, so as to guarantee a performance of the organic light emitting device. For example, the light emitting layer 130 is provided to cover the first electrode 140 of the organic light emitting device, such that the light emitting layer 130 separates the first electrode 140 from the second reflective layer 120 or the second electrode 150, so as to guarantee the performance of the organic light emitting device.

Exemplarily, as shown in FIG. 5A, the light-emitting structure 100 in the first sub-pixel 1000 and the light-emitting structure 100 in the second sub-pixel 2000 share the same second reflective layer 120, and other structures (for example, the first reflective layer 110, the first electrode 140, the light emitting layer 130, the second electrode 150 or the optical medium layer 160, etc.) in the light-emitting structure 100 may be separately provided, so that at an end, close to the base 200, of the light-emitting structure 100, the distance between the first reflective layer 110 and the second reflective layer 120 is further reduced, to further enhance the light emission amount of the end (corresponding to the second portion 112 of the first reflective layer 110), facing away from the base 200, of the light-emitting structure 100. For example, at least a portion of the structures, for example, the light emitting layer 130, etc. in the light-emitting structure 100 as shown in FIG. 5A is prepared in a mode such as vacuum evaporation, so as to form different types of light emitting layers 130 in different sub-pixels.

Figure 6:
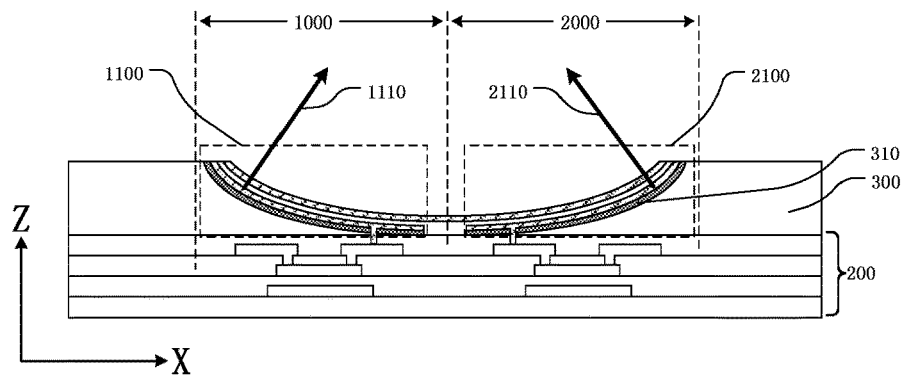
FIG. 6 is another cross-sectional view of the display substrate provided by at least one embodiment of the present disclosure.
Figure 7:
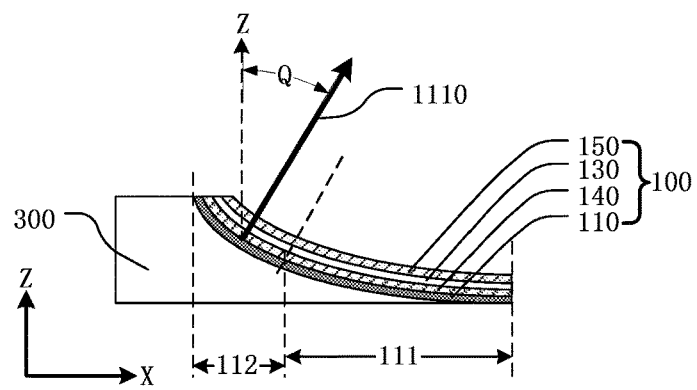
FIG. 7 is a partial structural schematic diagram of the display substrate shown in FIG. 6.

For example, in the display substrate provided by at least one embodiment of the present disclosure, the first light-emitting element and the second light-emitting element each have the light-emitting structure, the light-emitting structure includes the first reflective layer and the light emitting layer provided on the first reflective layer; the light emitting layer is located on the light emergent side of the display substrate; and the upper surface of the first reflective layer is an inclined surface with respect to the plane where the display substrate is located. FIG. 6 is a cross-sectional view of another display substrate provided by at least one embodiment of the present disclosure; and FIG. 7 is a partial structural schematic diagram of the display substrate shown in FIG. 6. Exemplarily, as shown in FIG. 6 and FIG. 7, the light-emitting structure 100 includes the first reflective layer 110 and the light emitting layer 130 provided on a side, facing away from the base 200, of the first reflective layer 110; and an upper surface of the first reflective layer 110 intersects with a plane where the display substrate is located. Thus, a propagation direction of a major portion of light emitted from the light emitting layer 130 is perpendicular to the upper surface of the first reflective layer 110, that is, the propagation direction of light emitted from the first light-emitting element 1100 still tends to the first direction 1110, and the propagation direction of light emitted from the second light-emitting element 2100 still tends to the second direction 2110, so that the display substrate implements the three-dimensional display. In addition, the first reflective layer 110 is set as an inclined surface, which increases an area of the light emitting layer 130, that is, increases a light emission area of the light-emitting structure 100, and improves brightness of the display image of the display substrate.

For example, in the display substrate provided by at least one embodiment of the present disclosure, an included angle between the upper surface of the first reflective layer and the plane where the display substrate is located is 15 to 45 degrees, and further, for example, about 20 degrees, about 30 degrees, about 40 degrees, and so on.

It should be noted that, as compared with the light-emitting structure according to the at least one embodiment shown in FIG. 2 and FIG. 3A, in the embodiment shown in FIG. 6 and FIG. 7, the light-emitting structure 100 is not provided with the second reflective layer 120, and light generated by the light emitting layer 130 is emitted out directly or reflected by first reflective layer 110. Therefore, the light-emitting structure according to the at least one embodiment shown in FIG. 2 and FIG. 3A may be referred to for a specific design of the light-emitting structure according to the embodiment shown in FIG. 6 and FIG. 7, which will not be repeated here in at least one embodiment of the present disclosure.

In at least one embodiment of the present disclosure, a specific mode in which the first reflective layer in the light-emitting structure is designed as the inclined surface or the second portion in the first reflective layer is designed as the inclined surface will not be limited.

For example, in at least one embodiment of the present disclosure, the display substrate further comprises a pixel defining layer provided on the base, and the pixel defining layer defines a position of the light-emitting structure. For example, a plurality of grooves are provided in the pixel defining layer, the light-emitting structure is located in the groove, the groove includes at least one first side surface which is an inclined surface with respect to the plane where the display substrate is located, and the second portion is located on the first side surface, so that the upper surface of the second portion is also an inclined surface with respect to the plane where the display substrate is located. For example, the first reflective layer and/or the second reflective layer are entirely located on the first side surface. Exemplarily, as shown in FIG. 2, FIG. 3A, FIG. 3B, FIG. 4, FIG. 6 and FIG. 7, the pixel defining layer 300 is provided on the base 200, and the light-emitting structure 100 is located in the groove 310 of the pixel defining layer 300. A portion of or a whole of the first side surface (not shown, please refer to the first side surface 31 of FIG. 9C) of the groove 310 is set as the inclined surface, so that the first reflective layer 110 formed on the first side surface has a corresponding shape. Related content in at least one embodiment below (the embodiment about the preparation method of the display substrate) may be referred to for a method for forming the groove 310 of the above-described structure, which will not be repeated here in at least one embodiment of the present disclosure.

For example, in at least one embodiment of the present disclosure, a portion, that overlaps with the second portion, of the first side surface is the flat surface or the curved surface. Thus, the upper surface of the second portion is correspondingly formed as the flat surface or the curved surface. For example, the first side surface is entirely the flat surface or the curved surface.

In at least one embodiment of the present disclosure, arrangement of the first sub-pixel and the second sub-pixel on the display substrate is not limited, and arrangement of a light emission color of the first sub-pixel and a light emission color of the second sub-pixel is not limited, as long as the plurality of first sub-pixels and the plurality of second sub-pixels respectively constitute parallax images, and the parallax image constituted by the plurality of first sub-pixels is different from the parallax image constituted by the plurality of second sub-pixels, so that the display substrate implements the three-dimensional display.

Exemplarily, as shown in FIG. 1, the plurality of first sub-pixels 1000 and the plurality of second sub-pixels 2000 are alternately arranged. Further, the first sub-pixel 1000 and the second sub-pixel 2000 adjacent to each other are provided in a pair, for example, in a same groove 310 of the pixel defining layer 300. Thus, the preparation process of the display substrate is simplified (for example, the preparation process for forming the groove 310 in the pixel defining layer 300 is simplified).

Figure 8A:
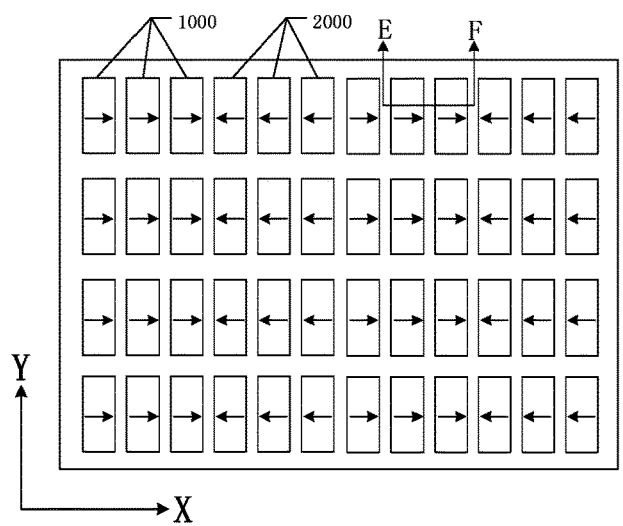
FIG. 8A is another plan view of the display substrate provided by at least one embodiment of the present disclosure.
Figure 8B:
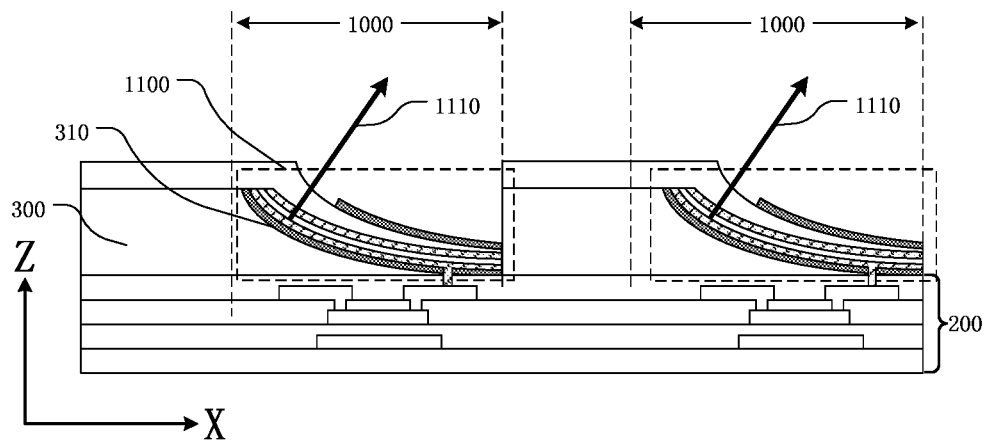
FIG. 8B is a cross-sectional view of the display substrate shown in FIG. 8A taken along E-F.

Exemplarily, FIG. 8A is a plan view of another display substrate provided by at least one embodiment of the present disclosure; FIG. 8B is a cross-sectional view of the display substrate shown in FIG. 8A along E-F; and FIG. 8B is a cross-sectional view of adjacent first sub-pixels 1000 shown in FIG. A. As shown in FIG. 8A and FIG. 8B, a plurality of adjacent first sub-pixels 1000 are set as a group, a plurality of adjacent second sub-pixels 2000 are set as another group, and the group of the plurality of first sub-pixels 1000 and the group of the plurality of second sub-pixels 2000 are alternately arranged on the display substrate. For example, three adjacent first sub-pixels 1000 are set as a group, and each group of the first sub-pixels 1000 includes sub-pixels that respectively emit light of red, green and blue; and three adjacent second sub-pixels 2000 are set as a group, and each group of the second sub-pixels 2000 includes sub-pixels that respectively emit light of red, green and blue.

At least one embodiment of the present disclosure provides a display panel, comprising the display substrate according to any one of the above-described embodiments. For example, the display substrate in the display panel is a flexible substrate, so as to be applied to a field of flexible display. For example, in the display panel provided by the embodiments of the present disclosure, a touch substrate is provided on the display substrate so that the display panel obtains a touch display function.

For example, the display panel is a television, a digital photo frame, a mobile phone, a watch, a tablet personal computer, a laptop, a navigator, and any other product or component having a display function.

At least one embodiment of the present disclosure provides the preparation method of the display substrate, the display substrate comprises at least one first sub-pixel and at least one second sub-pixel, and the method comprises: forming the first light-emitting element in the first sub-pixel and forming the second light-emitting element in the second sub-pixel; the light emission direction of the first light-emitting element and the light emission direction of the second light-emitting element are different from each other, such that the first sub-pixel and the second sub-pixel have different display directions. For example, the first light-emitting element is formed such that the normal to the light emergent surface thereof has the first direction, the first direction is the display direction of the first sub-pixel; the second light-emitting element is formed such that the normal to the light emergent surface thereof has the second direction, and the second direction is the display direction of the second sub-pixel. For example, the first direction and the second direction intersect with each other. In the display substrate obtained by using the above-described preparation method, the first sub-pixel and the second sub-pixel emit light in different directions, that is, light emitted from the first sub-pixel and light emitted from the second sub-pixel directly constitute different parallax images, so that the display substrate has the three-dimensional display function, and thus, light constituting the parallax images is not lost, so that the parallax images have a higher brightness. In addition, light emitted from each sub-pixel of the display substrate is received by the user, which ensures that the three-dimensional display image provided by the display substrate has a higher resolution.

For example, in the preparation method of the display substrate provided by at least one embodiment of the present disclosure, the first light-emitting element and the second light-emitting element each include the light-emitting structure, and forming the light-emitting structure includes: forming the first reflective layer, the second reflective layer opposite to the first reflective layer, and the light emitting layer provided between the first reflective layer and the second reflective layer, in which, the second reflective layer is located on the light emergent side of the display substrate, and the area of the first reflective layer is larger than the area of the second reflective layer. For example, the first reflective layer includes the first portion overlapping with the second reflective layer in the light emission direction of the light-emitting structure and the second portion not overlapping with the second reflective layer in the light emission direction of the light-emitting structure. In the display substrate obtained by using the above-described preparation method, light emitted from the light emitting layer in the light-emitting structure is totally reflected between the first reflective layer and the second reflective layer, then converged on the second portion of the first reflective layer and reflected out by the second portion, so that light of the light-emitting structure tends to be in a same direction (for example, the first direction or the second direction), which improves brightness of light emitted from the light-emitting structure.

For example, the preparation method of the display substrate provided by at least one embodiment of the present disclosure further comprises: forming the pixel defining layer, forming the plurality of grooves in the pixel defining layer, and forming at least one first side surface of the groove into the inclined surface with respect to the plane where the display substrate is located, in which, the light-emitting structure is formed in the groove, and the second portion of the first reflective layer is formed on the first side surface. Related description in the foregoing embodiments may be referred to for the structure of the display substrate obtained by using the preparation method, which will not be repeated here.

For example, in the preparation method of the display substrate provided by at least one embodiment of the present disclosure, a portion, that overlaps with the second portion, of the first side surface is formed into the flat surface or the curved surface. Related description in the foregoing embodiments may be referred to for the structure of the display substrate obtained by using the preparation method, which will not be repeated here.

For example, the preparation method of the display substrate provided by at least one embodiment of the present disclosure further comprises: forming the optical medium layer between the first reflective layer and the light emitting layer or between the light emitting layer and the second reflective layer. The optical medium layer increases the distance between the first reflective layer and the second reflective layer, to prevent light from interfering between the first reflective layer and the second reflective layer.

For example, in the preparation method of the display substrate provided by at least one embodiment of the present disclosure, the first light-emitting element and the second light-emitting element each include the light-emitting structure, and forming the light-emitting structure includes: forming the first reflective layer, and forming the light emitting layer on the first reflective layer, the light emitting layer being formed on the light emergent side of the display substrate, in which, the upper surface of the first reflective layer has a tilt angle with respect to the plane where the base is located, and thus is the inclined surface with respect to the plane where the display substrate is located. The first reflective layer is formed as the inclined surface, which increases the area of the light emitting layer, that is, increases the light emission area of the light-emitting structure, and improves brightness of the display image of the display substrate.

It should be noted that, related content in the foregoing embodiments (the embodiments about the display substrate) may be referred to for the structure of the display substrate obtained by using the above-described preparation method, which will not be repeated here in at least one embodiment of the present disclosure.

Hereinafter, in at least one embodiment of the present disclosure, the preparation method of the display substrate will be described, and FIG. 9A to FIG. 9F are procedure diagrams of the preparation method of the display substrate provided by at least one embodiment of the present disclosure. For example, as shown in FIG. 9A to FIG. 9F, with the display substrate as shown in FIG. 2 as an example, the preparation method of the display substrate provided by at least one embodiment of the present disclosure comprises a procedure below.

Figure 9A:
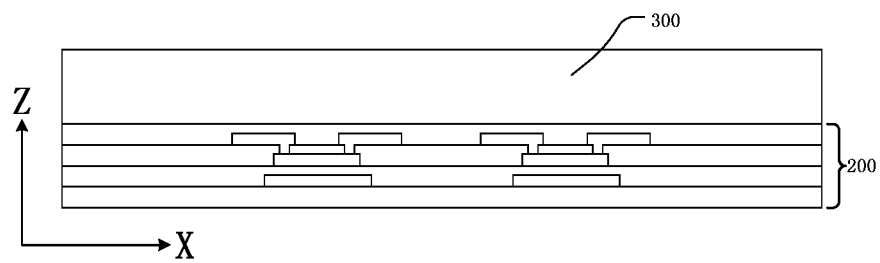
FIG. 9A to FIG. 9F are flow diagrams of a preparation method of a display substrate provided by at least one embodiment of the present disclosure.

As shown in FIG. 9A, the base 200 is provided and a thin film of an insulating material is deposited on the base 200 to form the pixel defining layer 300. The base 200 for example is an array substrate, and a plurality of switching elements for example, thin film transistors and a corresponding control circuit, etc. are provided in the base 200. A preparation method of a conventional array substrate may be referred to for the preparation mode of the base 200, which will not be repeated here in at least one embodiment of the present disclosure.

For example, the pixel defining layer 300 is made of positive photoresist.

Figure 9B:
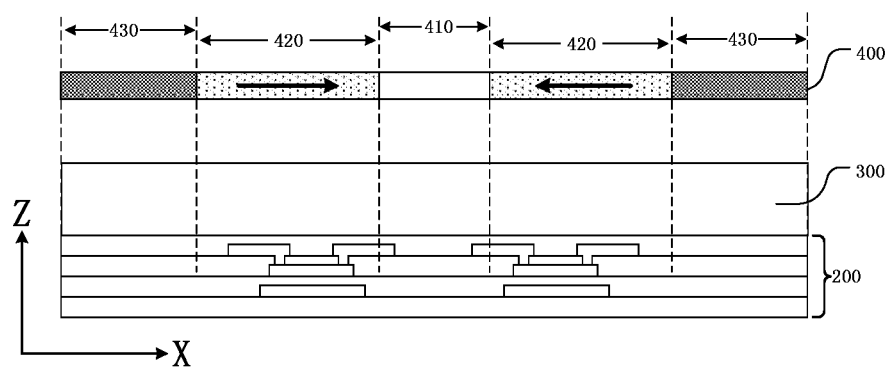
Figure 9C:
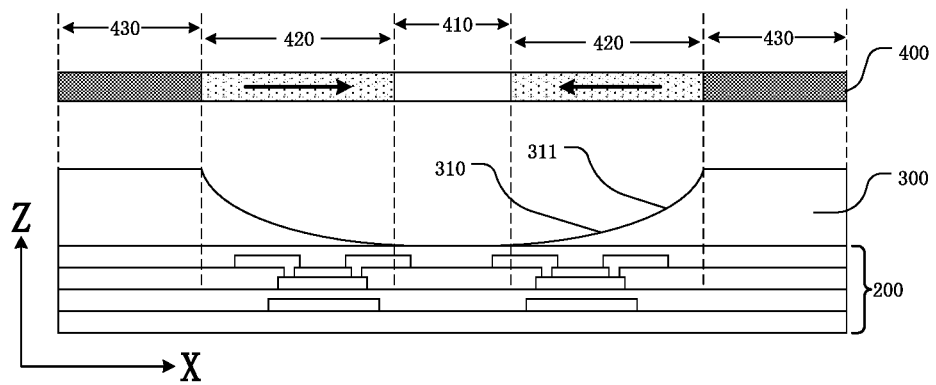

As shown in FIG. 9B and FIG. 9C, a mask 400 is provided, then the pixel defining layer 300 is exposed and developed, and then the groove 310 is formed in the pixel defining layer 300.

For example, the mask 400 includes a first region 410, a second region 420 and a third region 430; the first region 410 is a transparent region, the second region 420 is a light transmittance gradient region, and the third region 430 is a light-shielding region. For example, the first region 410 and the second region 420 adjacent thereto are used for forming the groove 310, the first region 410 is located between two second regions 420, and the second region 420 corresponds to the first side surface 311 of the groove 310 to be formed. In a direction from an end, close to the third region 430, of the second region 420 to an end, close to the first region 410, of the second region 420 (a direction indicated by an arrow "→" in FIG. 9B and FIG. 9C), light transmittance of the second region 420 gradually increases, and thus, the groove 310 as shown in FIG. 9C is formed after the pixel defining layer 300 is exposed and developed.

It should be noted that, specific design of the mask 400 may be selected according to a specific shape of the groove 310. For example, in a case where two first side surfaces 311 of the groove 310 are connected with each other (for example, a cross-sectional shape of the groove is an arc), the first region 410 is not provided in the mask 400.

Figure 9D:
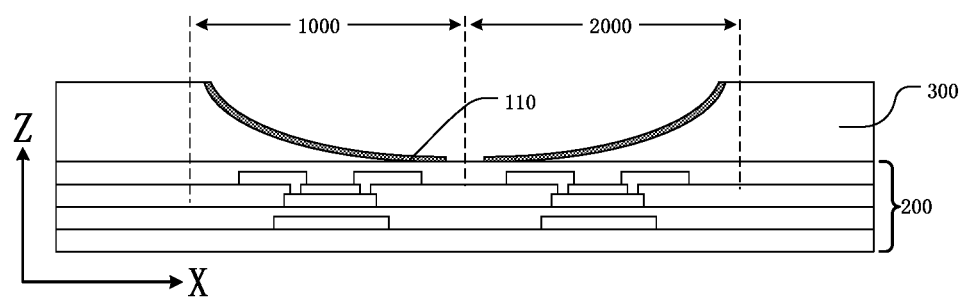

As shown in FIG. 9D, a thin film of a reflective material is deposited on the base 200, and a patterning process is performed on it to form the first reflective layer 110.

A material for preparing the first reflective layer 110 is not limited in at least one embodiment of the present disclosure. For example, the material for preparing the first reflective layer 110 includes metals, for example, gold, silver, copper and aluminum, etc., and alloys thereof. It should be noted that, in a case where the first reflective layer 110 is made of a conductive material, the first reflective layer 110 in the first sub-pixel 1000 and the first reflective layer 110 in the second sub-pixel 2000 are spaced apart from each other; and in a case where the first reflective layer 110 is made of an insulating material, the first reflective layer 110 in the first sub-pixel 1000 and the first reflective layer 110 in the second sub-pixel 2000 may be spaced apart from each other, and may be integrally provided.

For example, in at least one embodiment of the present disclosure, a patterning process is, for example, a photolithography patterning process, which, for example, includes: coating a photoresist film on a structural layer that needs to be patterned, in which, the coating of the photoresist film for example is spin coating, knife coating or roller coating; next, exposing the photoresist film with a mask, developing the exposed photoresist film to obtain a photoresist pattern; then etching the structural layer with the photoresist pattern as a mask; and finally stripping off remaining photoresist to form a desired pattern.

In at least one embodiment of the present disclosure, a specific mode for forming the first reflective layer 110 in the groove 310 is not limited. For example, in at least one embodiment of the present disclosure, the first reflective layer 110 is formed in the groove 310 by magnetron sputtering or vacuum evaporation.

Figure 9E:
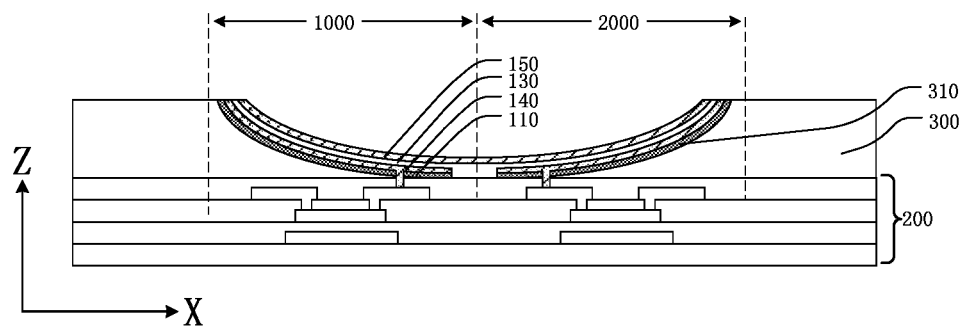

As shown in FIG. 9E, the organic light emitting device is formed in the groove 310, that is, the organic light emitting device is formed respectively in the first sub-pixel 1000 and the second sub-pixel 2000.

For example, a procedure for forming the organic light emitting device includes: sequentially forming the first electrode 140, the organic light emitting layer (the light emitting layer 130), and the second electrode 150 in the groove 310. For example, the second electrode 150 in the first sub-pixel 1000 and the second electrode 150 in the second sub-pixel 2000 is set as an integrated structure without affecting the display function of the display substrate, and further, the second electrode 150 for example is provided to cover a surface of the display substrate so as to serve as the common electrode of all the sub-pixels, which simplifies a preparation process of the display substrate and reduces costs. For example, in a case where the first reflective layer 110 serves as the electrode of the organic light emitting device, it is not necessary to form the first electrode 140.

For example, before the first electrode 140 is formed, the first reflective layer 110 and a related structure of the base 200 are patterned to form a via hole, so that the first electrode 140 is electrically connected with the switching element in the base 200. For example, a structure such as the hole injection layer, the hole transport layer, the electron transport layer and the electron injection layer are further formed in the organic light emitting device. A conventional preparation method of the organic light emitting device may be referred to for a specific method for forming the organic light emitting device, which will not be repeated here in at least one embodiment of the present disclosure. For example, the hole injection layer, the hole transport layer, the electron transport layer, the electron injection layer and the second electrode 150 cover the entire groove 310, so as to serve as common structures of the first sub-pixel 1000 and the second sub-pixel 2000. For example, the light emitting layer 130 covers the entire groove 310, so as to serve as the common structure of the first sub-pixel 1000 and the second sub-pixel 2000; or is formed respectively in the first sub-pixel 1000 and the second sub-pixel 2000 in a mode of, for example, vacuum evaporation.

Figure 9F:
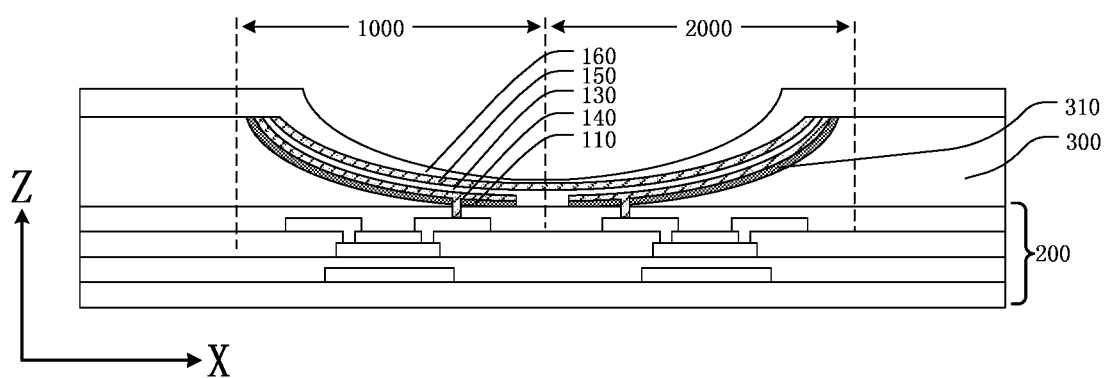

As shown in FIG. 9F, a thin film of a transparent material is deposited on the base 200 and a patterning process is performed on it to form the optical medium layer 160. For example, a thickness of the optical medium layer 160 increases as the distance of the optical medium layer 160 from the base 200 increases.

For example, the optical medium layer 160 is made of photoresist. Related description of forming the groove 310 as shown in FIG. 9B and FIG. 9C may be referred to for the method for forming the optical medium layer 160 with a shape shown in FIG. 9F, which will not be repeated here in at least one embodiment of the present disclosure.

As shown in FIG. 2, a thin film of a reflective material is deposited on the base 200 and a patterning process is performed on it to form the second reflective layer 120. A material for preparing the second reflective layer 120 is not limited in at least one embodiment of the present disclosure. For example, in some embodiments of the present disclosure, the second reflective layer 120 is a single reflective layer, and a material for preparing the second reflective layer 120 includes metals, for example, gold, silver, copper and aluminum, etc., and alloys thereof. For example, in other embodiments of the present disclosure, the second reflective layer 120 is a composite layer, and the composite layer is a highly reflective film system composed of a plurality of film layers. For example, the highly reflective film system includes a film system in which a high refractive index film and a low refractive index film are alternately stacked. For example, the high refractive index film is made of zinc sulfide, and the like; and the low refractive index film is made of magnesium fluoride, and the like. For example, the high refractive index film and the low refractive index film have an optical thickness set to ¼ of a wavelength of light to be reflected.

It should be noted that, in the procedure of the preparation method of the display substrate shown in FIG. 9A to FIG. 9F and FIG. 2, it is not necessary to prepare the optical medium layer 160 and the second reflective layer 120 to form the display substrate as shown in FIG. 6.

At least one embodiment of the present disclosure provides the display substrate and the preparation method thereof, and the display panel, which have at least one advantageous effect below:

(1) In the display substrate provided by at least one embodiment of the present disclosure, the first sub-pixel and the second sub-pixel emit light in different directions, that is, light emitted from the first sub-pixel and light emitted from the second sub-pixel directly constitute different parallax images, so that the display substrate has the three-dimensional display function, and the brightness and the resolution of the display image are improved.

(2) In the display substrate provided by at least one embodiment of the present disclosure, at least a portion of the light-emitting structure is provided obliquely with respect to the plane where the display substrate is located, which increases the light emission area of the light-emitting structure, and further increases the brightness of the display image of the display substrate.

With respect to the present disclosure, several points below need to be explained:

(1) The drawings of the embodiments of the present disclosure relate only to the structures involved in the embodiments of the present disclosure, and normal designs may be referred to for other structures.

(2) For the sake of clarity, in the drawings used for describing the embodiments of the present disclosure, thicknesses of layers or regions are enlarged or reduced, that is, these drawings are not drawn in an actual scale.

(3) In case of no conflict, the embodiments of the present disclosure and the features in the embodiments may be combined with each other to obtain a new embodiment.

The above are only specific embodiments of the present disclosure, but the scope of the embodiment of the present disclosure is not limited thereto, and the scope of the present disclosure should be the scope of the following claims.

The invention claimed is:

1. A display substrate, comprising:
a first sub-pixel and a second sub-pixel, the first sub-pixel and the second sub-pixel having different display directions,
wherein, the first sub-pixel includes a first light-emitting element and the second sub-pixel includes a second light-emitting element; each of the first light-emitting element and the second light-emitting element has a light-emitting structure, the light-emitting structure includes a first reflective layer, a second reflective layer opposite to the first reflective layer, and a light emitting layer provided between the first reflective layer and the second reflective layer, the second reflective layer is located on a light emergent side of the display substrate; a light emission direction of the first light-emitting element and a light emission direction of the second light-emitting element are different from each other, such that the first sub-pixel and the second sub-pixel have different display directions; and
an area of the first reflective layer is larger than an area of the second reflective layer.

2. The display substrate according to claim 1, wherein, in the light-emitting structure, the first reflective layer includes a first portion overlapping with the second reflective layer along the display direction and a second portion not overlapping with the second reflective layer along the display direction.

3. The display substrate according to claim 2, wherein, an included angle between a tangent plane of a surface, facing the light emitting layer, of the second portion and a plane where the display substrate is located is about 15 to 45 degrees.

4. The display substrate according to claim 2, wherein, the second portion is located at an end, close to an upper surface of the display substrate, of the first reflective layer; or
the second portion is located in a middle portion of the first reflective layer.

5. The display substrate according to claim 2, wherein, an area ratio of the second portion to the first reflective layer is 5% to 15%.

6. The display substrate according to claim 2, wherein, a distance between an end, close to the second portion, of the first portion and the second reflective layer is greater than a distance between an end, facing away from the second portion, of the first portion and the second reflective layer.

7. The display substrate according to claim 2, wherein, from an end, facing away from the second portion, of the first portion to an end, close to the second portion, of the first portion, a distance between the first reflective layer and the second reflective layer gradually increases.

8. The display substrate according to claim 2, further comprising a pixel defining layer, wherein,
a groove is provided in the pixel defining layer, the light-emitting structure is located in the groove, and
the groove includes a first side surface which is an inclined surface with respect to a plane where the display substrate is located, and the second portion is located on the first side surface.

9. The display substrate according to claim 8, wherein, a portion, overlapping with the second portion, of the first side surface is a flat surface or a curved surface.

10. The display substrate according to claim 2, wherein, the light-emitting structure includes an organic light emitting device, the light emitting layer is an organic light emitting layer, the organic light emitting device includes a first electrode, a second electrode, and the organic light emitting layer located between the first electrode and the second electrode; and the second electrode is located on the light emergent side of the display substrate.

11. The display substrate according to claim 10, wherein, the first electrode and the first reflective layer are integral; and/or
the second electrode and the second reflective layer are integral.

12. The display substrate according to claim 10, wherein, at least one of the first light-emitting element and the second light-emitting element further includes: an optical medium layer, located between the first reflective layer and the light emitting layer or located between the second reflective layer and the light emitting layer.

13. The display substrate according to claim 12, wherein, a thickness of a portion, overlapping with the second portion, of the optical medium layer is greater than a thickness of a portion, overlapping with the first portion, of the optical medium layer.

14. The display substrate according to claim 13, wherein, from an end, facing away from the second portion, of the first portion to an end, close to the second portion, of the first portion, the thickness of the portion, overlapping with the first portion, of the optical medium layer gradually increases.

15. The display substrate according to claim 1, wherein, a tangent plane of a surface, facing the light emitting layer, of the first reflective layer with respect to a plane where the display substrate is located is an inclined surface.

16. The display substrate according to claim 15, wherein, an included angle between the tangent plane of the surface, facing the light emitting layer, of the first reflective layer and the plane where the display substrate is located is about 15 to 45 degrees.

17. A display panel, comprising the display substrate according to claim 1.

18. A preparation method of a display substrate, wherein, the display substrate comprises a first sub-pixel and a second sub-pixel, and the method comprises:
  forming a light-emitting structure, the light-emitting structure including a first reflective layer, a second reflective layer opposite to the first reflective layer, and a light emitting layer located between the first reflective layer and the second reflective layer;
  forming a first light-emitting element including the light-emitting structure in the first sub-pixel, and forming a second light-emitting element including the light-emitting structure in the second sub-pixel;
  wherein, the second reflective layer is located on a light emergent side of the display substrate, and an area of the first reflective layer is larger than an area of the second reflective layer; and
  a light emission direction of the first light-emitting element and a light emission direction of the second light-emitting element are different from each other, such that the first sub-pixel and the second sub-pixel have different display directions.

19. The preparation method according to claim 18, further comprising:
  forming a pixel defining layer, forming a groove in the pixel defining layer, and forming a first side surface of the groove into an inclined surface with respect to a plane where the display substrate is located;
  wherein, in the light-emitting structure, the first reflective layer includes a first portion overlapping with the second reflective layer along the display direction and a second portion not overlapping with the second reflective layer along the display direction, and
  the light-emitting structure is formed in the groove, and the second portion of the first reflective layer is formed on the first side surface.

20. The preparation method according to claim 19, wherein,
  a portion, overlapping with the second portion, of the first side surface is formed into a flat surface or a curved surface.

* * * * *